United States Patent
Mizutani

(10) Patent No.: US 12,048,100 B2
(45) Date of Patent: Jul. 23, 2024

(54) MANAGEMENT DEVICE, MOBILE WORK DEVICE, MOUNTING SYSTEM, AND MANAGEMENT METHOD

(71) Applicant: FUJI CORPORATION, Chiryu (JP)

(72) Inventor: Yutaka Mizutani, Kaizu (JP)

(73) Assignee: FUJI CORPORATION, Chiryu (JP)

( * ) Notice: Subject to any disclaimer, the term of this patent is extended or adjusted under 35 U.S.C. 154(b) by 566 days.

(21) Appl. No.: 17/432,109

(22) PCT Filed: Mar. 12, 2019

(86) PCT No.: PCT/JP2019/009927
§ 371 (c)(1),
(2) Date: Aug. 19, 2021

(87) PCT Pub. No.: WO2020/183599
PCT Pub. Date: Sep. 17, 2020

(65) Prior Publication Data
US 2022/0346293 A1    Oct. 27, 2022

(51) Int. Cl.
*H05K 13/08*    (2006.01)
*H05K 13/04*    (2006.01)

(52) U.S. Cl.
CPC ....... *H05K 13/085* (2018.08); *H05K 13/0417* (2013.01)

(58) Field of Classification Search
CPC ............. H05K 13/085; H05K 13/0417; H05K 13/021; H05K 13/086
See application file for complete search history.

(56) References Cited

U.S. PATENT DOCUMENTS

2016/0353621 A1*  12/2016  Maezono ........... H05K 13/0417
2016/0353624 A1*  12/2016  Maezono ............... H05K 13/08
2017/0061365 A1*  3/2017  Nonoyama ............ H05K 13/02

FOREIGN PATENT DOCUMENTS

| JP | 2005-235952 A | 9/2005 |
| WO | WO 2017/033268 A1 | 3/2017 |
| WO | WO 2018/179147 A1 | 10/2018 |
| WO | WO 2018/198333 A1 | 11/2018 |

OTHER PUBLICATIONS

International Search Report mailed on Jun. 4, 2019 in PCT/JP2019/009927 filed on Mar. 12, 2019 (2 pages).

* cited by examiner

*Primary Examiner* — Charles R Kasenge
(74) *Attorney, Agent, or Firm* — Oblon, McClelland, Maier & Neustadt, L.L.P.

(57) ABSTRACT

A management device causes a mobile work device to execute a pre-replacement process of detaching a pre-served feeder from a mounting attachment portion before a component shortage of a feeder and attaching a replacement feeder corresponding to a feeder predicted to be subjected to the component shortage to the mounting attachment portion from which the pre-served feeder is detached when the feeder attached to the mounting attachment portion is predicted to be subjected to the component shortage and the mounting attachment portion is in a predetermined serving state such that there is no vacancy in the mounting attachment portion and the pre-served feeder to be used in the next and subsequent productions is attached to a part of the mounting attachment portion.

10 Claims, 9 Drawing Sheets

Fig. 6A

| PREDETERMINED PERIOD | PRODUCTION | MOUNTING ATTACHMENT PORTION NUMBER | | | | | | | | | | COMPONENT SHORTAGE |
|---|---|---|---|---|---|---|---|---|---|---|---|---|
| | | #1 | #2 | #3 | #4 | #5 | #6 | #7 | #8 | #9 | #10 | |
| 00:00 | | P01 | P02 | P03 | P04 | P05 | P06 | P07 | P08 | P09 | P10 | |
| 00:10 | | P01 | P02 | P03 | P04 | P05 | P06 | P07 | P08 | *P09* | *P10* | |
| 00:20 | PRODUCTION 1 | P01 | P02 | P03 | P04 | P05 | P06 | P07 | P08 | P09 | P10 | 3 |
| 00:30 | | P01 | P02 | P03 | P04 | P05 | P06 | P07 | P08 | P09 | P10 | |
| 00:40 | | P01 | P02 | P03 | P04 | P05 | P06 | P07 | P08 | P09 | P10 | 1 |
| 00:50 | PRODUCTION 2 | P01 | P11 | P03 | P12 | P13 | P06 | P14 | P15 | P09 | P10 | |
| 01:00 | | P01 | P11 | P03 | P12 | P13 | P06 | P14 | P15 | P09 | P10 | |
| ⋮ | ⋮ | | | | ⋮ | | | | | | | ⋮ |

※ | P01 | : FEEDER HAVING COMPONENT TYPE OF P01

▨ : FEEDER REQUIRED TO BE REPLACED DUE TO COMPONENT SHORTAGE

▦ : PRE-SERVED FEEDER

Fig. 6B

| PREDETERMINED PERIOD | PRODUCTION | MOUNTING ATTACHMENT PORTION NUMBER | | | | | | | | | |
|---|---|---|---|---|---|---|---|---|---|---|---|
| | | #11 | #12 | #13 | #14 | #15 | #16 | #17 | #18 | #19 | #20 |
| 00:00 | | P11 | P12 | P13 | P14 | P15 | P16 | P17 | | | |
| 00:10 | | P11 | P12 | P13 | P14 | P15 | P16 | P17 | | *P09* | *P10* |
| 00:20 | PRODUCTION 1 | P11 | P12 | P13 | P14 | P15 | P16 | P17 | | | |
| 00:30 | | P11 | P12 | P13 | P14 | P15 | P16 | P17 | | | |
| 00:40 | | P11 | P12 | P13 | P14 | P15 | P16 | P17 | | | |
| 00:50 | PRODUCTION 2 | P18 | P19 | P20 | P21 | P22 | P16 | P17 | | | |
| 01:00 | | P18 | P19 | P20 | P21 | P22 | P16 | P17 | | | |
| ⋮ | ⋮ | | | | ⋮ | | | | | | |

※ | *P10* | : FEEDER HAVING COMPONENT TYPE OF P10 AND TEMPORARILY RETRACTED

MANAGEMENT DEVICE, MOBILE WORK DEVICE, MOUNTING SYSTEM, AND MANAGEMENT METHOD

TECHNICAL FIELD

The present specification discloses a management device, a mobile work device, a mounting system, and a management method.

BACKGROUND ART

In the related art, a mounting system has been proposed in which a feeder storage is disposed in a production line and which includes an exchange robot (mobile work device) that is moved between a mounting device and the feeder storage to exchange feeders (refer to, for example, Patent Literature 1). In this mounting system, the feeders are exchanged by the mobile work device at a feeder exchange timing. A mounting device has been proposed that attaches a feeder for a component type of which component shortage occurs most quickly to a shared spare unit holding section and switches to pick up a component from the feeder of the shared spare unit holding section when component shortage of a feeder occurs (refer to, for example, Patent Literature 2). In this mounting device, it is possible to further suppress stopping the mounting device due to component shortage.

PATENT LITERATURE

Patent Literature 1: International Publication No. WO2017/33268
Patent Literature 2: JP-A-2005-235952

BRIEF SUMMARY

Technical Problem

Incidentally, in a mounting system, for example, when a production schedule of multiple types of boards is executed, a setup change process of exchanging feeders may be executed. In the mounting device, a feeder subjected to component shortage may be replaced during a mounting process. In order to support the setup change process, a feeder used for the next and subsequent mounting processes may be served in advance to a vacant attachment portion. In the mounting device disclosed in Patent Literature 2, a replacement feeder is attached to a vacant attachment portion, and, when a component shortage occurs in the feeder, a spare component pickup process in which a component is picked up from the replacement feeder and a mounting process is continued is performed, but there is a case where there is no vacant attachment portion in preparation for a setup change process. In this case, in the mounting device, the spare component pickup process cannot be executed, and thus the cycle time balance of the mounting process may be lost. In Patent Literature 1, such a problem is not particularly taken into consideration.

A principal object of the present disclosure is to provide a management device, a mobile work device, a mounting system, and a management method capable of efficiently performing a mounting process when a feeder is required to be replaced.

The present disclosure employs the following means in order to achieve the above principal object.

According to the present disclosure, there is provided a management device used in a mounting system provided with a mounting device including a mounting section configured to mount a component on a mounting target, a supply section configured to attach a feeder holding the component to an attachment portion having multiple mounting attachment portions from which the mounting section is capable of picking up the component, and a mounting control section configured to cause the mounting section to pick up the component from the feeder at a position designated in mounting condition information, while cause the mounting section to execute a spare component pickup process of picking up the component from a replacement feeder attached to a mounting attachment portion at a position not designated in the mounting condition information when a component shortage occurs in the feeder, and a mobile work device including an accommodation section configured to accommodate the feeder, and a moving control section configured to recover the feeder from the supply section and/or attach the feeder to the supply section and move the feeder, the management device including a management control section configured to cause the mobile work device to execute a pre-replacement process of detaching a pre-served feeder from the mounting attachment portion before the component shortage of the feeder and attaching a replacement feeder, corresponding to the feeder predicted to be subjected to the component shortage, to the mounting attachment portion from which the pre-served feeder is detached when the feeder attached to the mounting attachment portion is predicted to be subjected to the component shortage while the mounting attachment portion is in a predetermined serving state such that there is no vacancy in the mounting attachment portion and the pre-served feeder to be used in the next and subsequent productions is attached to a part of the mounting attachment portion.

In general, in a mounting device, a setup change process of replacing a feeder may be executed when productions are switched. In the mounting device, in consideration of efficiency improvement of feeder replacement work, a pre-serving process of attaching a feeder used in the next and subsequent productions a vacant attachment portion in advance may be performed. In the mounting device, a replacement feeder may be attached to a vacant mounting attachment portion in advance, and, when a component shortage occurs in a feeder, a spare component pickup process of temporarily picking up a component from the replacement feeder and continuing the mounting process may be executed. The management device causes the mobile work device to execute a pre-replacement process of detaching a pre-served feeder from the mounting attachment portion before the component shortage of the feeder and attaching a replacement feeder corresponding to the feeder predicted to be subjected to the component shortage to the mounting attachment portion from which the pre-served feeder is detached when the feeder attached to the mounting attachment portion is predicted to be subjected to the component shortage and the mounting attachment portion is in a predetermined serving state in which the pre-served feeder used in the next and subsequent productions is attached to a part of the mounting attachment portion without no vacancy in the mounting attachment portion. In the mounting device, since the replacement feeder is attached to the mounting attachment portion through the pre-replacement process, the mounting process can be continued by executing the spare component pickup process even when the component shortage occurs in the feeder. Therefore, in the management device, it is possible to efficiently execute the mounting process when the feeder is required to be replaced. The management device may set execution information in the pre-replacement process when the mobile work device executes the pre-replacement process, and output the set execution information to the mobile work device.

BRIEF DESCRIPTION OF DRAWINGS

FIG. 6 is an explanatory diagram illustrating an example of a production status related to prediction of component shortage.

DESCRIPTION OF EMBODIMENTS

Figure 1:
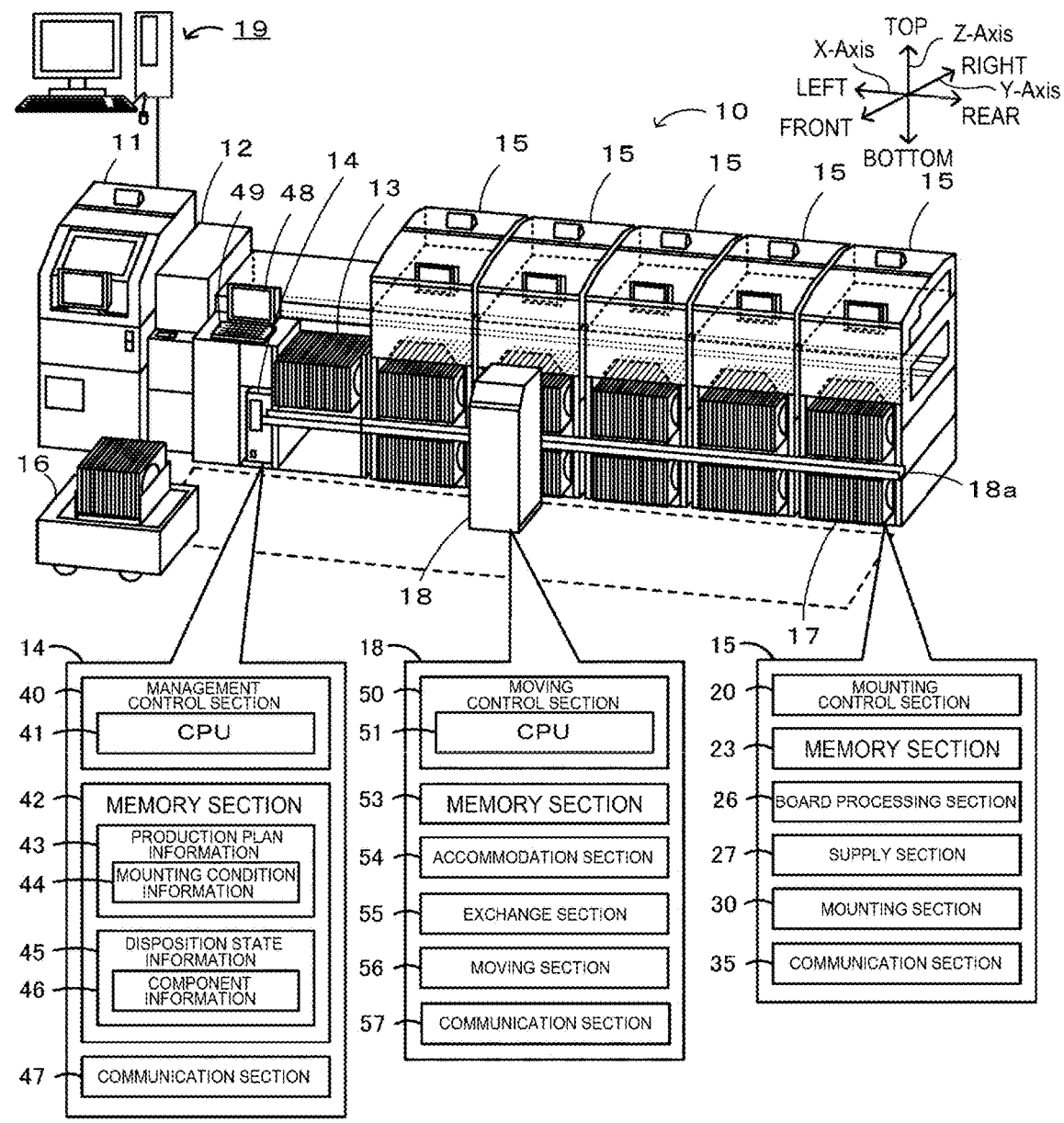
FIG. 1 is a schematic explanatory diagram illustrating an example of mounting system 10.
Figure 2:
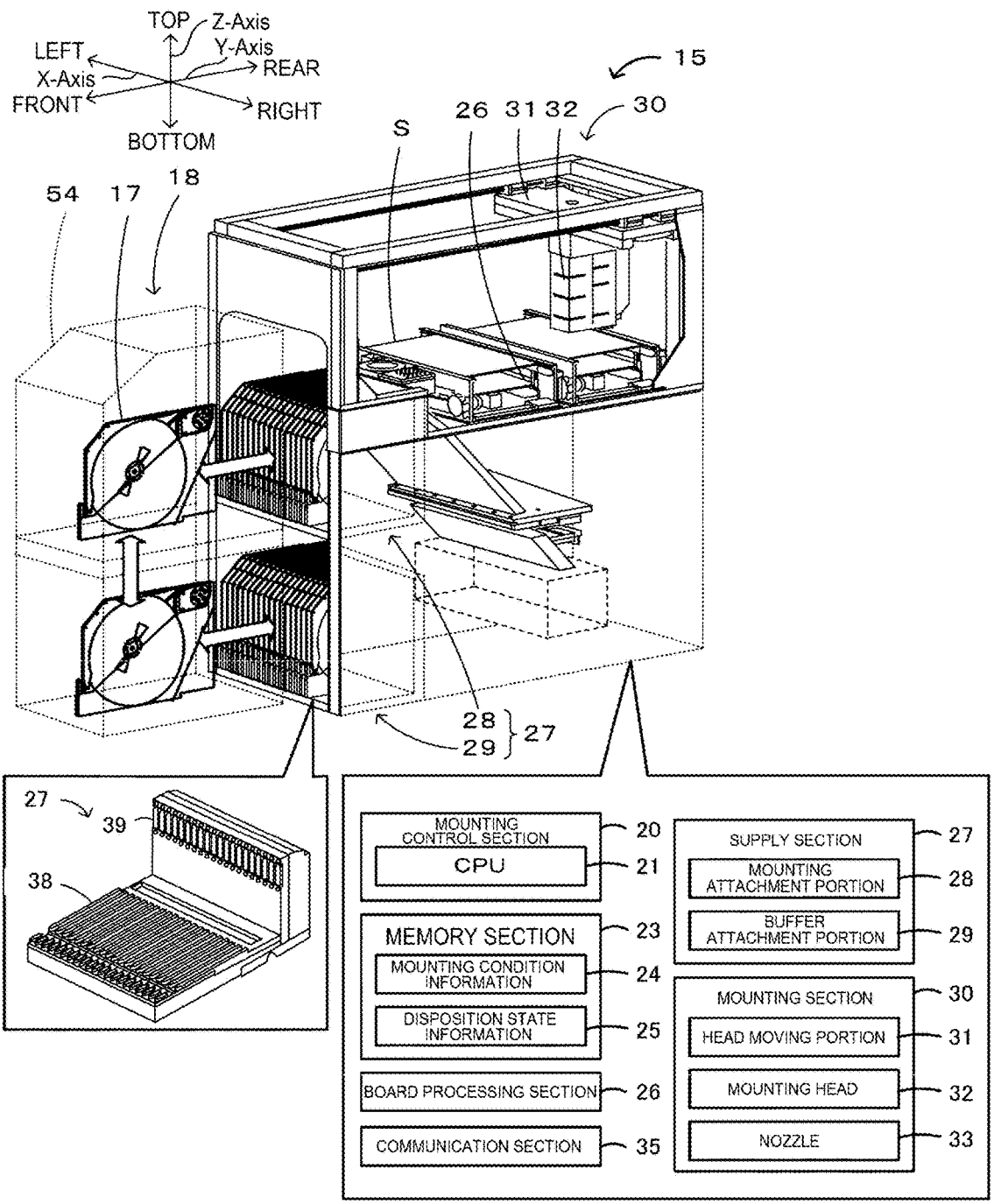
FIG. 2 is an explanatory diagram schematically illustrating configurations of mounting device 15 and loader 18.

Hereinafter, the present embodiment will be described with reference to the drawings. FIG. 1 is a schematic explanatory diagram illustrating an example of mounting system 10 of the present disclosure. FIG. 2 is an explanatory diagram schematically illustrating a configuration of mounting device 15 and loader 18 that is a mobile work device. In the present embodiment, a leftward-rightward direction (X-axis), a front-rear direction (Y-axis), and an upward-downward direction (Z-axis) are as illustrated in FIGS. 1 and 2.

Mounting system 10 is configured as, for example, a production line in which mounting devices 15 that perform a mounting process for mounting components on board S that is a mounting target are arranged in a conveyance direction of board S. Here, the mounting target is described as board S, but is not particularly limited to this as long as components are mounted thereon, and a substrate having a three-dimensional shape may be used. As illustrated in FIG. 1, mounting system 10 is configured to include printing device 11, print inspection device 12, storage section 13, management PC 14, mounting devices 15, automatic conveyance vehicle 16, loader 18, host PC 19, and the like. Printing device 11 is a device that prints a solder paste or the like on board S. Print inspection device 12 is a device that inspects a state of the printed solder.

Mounting devices 15 are devices that pick up components and mount the components on board S. Mounting device 15 includes mounting control section 20, memory section 23, board processing section 26, supply section 27, mounting section 30, and communication section 35. Mounting control section 20 is configured as a microprocessor centered on CPU 21 and controls the entire device, as illustrated in FIG. 2. Mounting control section 20 outputs control signals to board processing section 26, supply section 27, or mounting section 30 to cause mounting section 30 to pick up the components, while receives signals from board processing section 26, supply section 27, or mounting section 30. Mounting condition information 24, disposition state information 25, and the like are stored in memory section 23. Mounting condition information 24 is a production job and includes information such as information regarding a component, a disposition order in which components are mounted on board S, a component disposition position, and an attachment position of feeder 17 from which a component is picked up. Mounting condition information 24 is created by host PC 19 according to a pickup order and a disposition order having high mounting efficiency, and is transmitted from host PC 19 to be stored into memory section 23. Disposition state information 25 is information including, for example, the type of feeder 17 currently attached to supply section 27 of mounting device 15, component information including a component type and the remaining number of components possessed by feeder 17, and the like. In a case where feeder 17 is attached or detached, disposition state information 25 is appropriately updated to the current details. Communication section 35 is an interface that performs exchange of information with external devices such as management PC 14 and host PC 19.

Board processing section 26 is a unit that performs carrying in, conveyance, fixation of board S at a mounting position, and carrying out thereof. Board processing section 26 has a pair of conveyor belts that are provided to be spaced apart from each other in the front-rear direction and are stretched in the leftward-rightward direction in FIG. 2. Board S is conveyed by the conveyor belts. Board processing section 26 includes two pairs of the conveyor belts, and can convey and fix two boards S simultaneously.

Supply section 27 is a unit that supplies components to mounting section 30. Supply section 27 has feeders 17 each of which includes a reel around which a tape as a holding member holding a component is wound and which are attached to one or more attachment portions. As illustrated in FIG. 2, supply section 27 has two upper and lower attachment portions to which feeders 17 are attachable at the front. The upper stage is mounting attachment portion 28 from which the component can be picked up by mounting section 30, and the lower stage is buffer attachment portion 29 from which the component cannot be picked up by mounting section 30. Here, mounting attachment portion 28 and buffer attachment portion 29 are collectively referred to as attachment portions. The attachment portions may be managed in the unit of a module grouped into a predetermined number (for example, four or twelve). In mounting system 10, the attachment portions may be managed as one module for each mounting device 15, or may be managed as multiple modules included in mounting device 15. Feeder 17 from which the component is picked up by mounting head 32 is attached to mounting attachment portion 28. When there is a vacancy in mounting attachment portion 28, feeder 17 for setup change that is used in the next production is served in advance. Buffer attachment portion 29 is used in a case where feeder 17 that is to be used next or feeder 17 which has been used is temporarily stored. Buffer attachment portion 29 is served in advance with feeder 17 for provision that is replaced due to component shortage, feeder 17 for setup change that is used in the next production, or the like. Here, a feeder that has a tape holding the same component as that of feeder 17 subjected to component shortage and is used after replacement will be referred to as replacement feeder 17a, a feeder that is served in advance to mounting attachment portion 28 and is used in the next and subsequent productions will be referred to as pre-served feeder 17b, and a feeder that is predicted to be subjected to subsequent component shortage will be referred to as prediction feeder 17c (refer to FIG. 8). Supply section 27 has an attachment portion including multiple slots 38 arranged in the X direction at predetermined intervals, into which rail members of feeders 17 are inserted, and connection parts 39 into which connectors provided at the distal ends of feeders 17 are inserted. Feeder 17 includes a controller (not illustrated). The controller stores information such as an ID of the tape included in feeder 17, the component type, or the remaining number of components. In a case where feeder 17 is connected to connection part 39, the controller transmits the information regarding feeder 17 to mounting control section 20.

Mounting section 30 is a unit that picks up a component from supply section 27 and disposes the component on board S fixed to board processing section 26. Mounting section 30 includes head moving portion 31, mounting head 32, and nozzle 33. Head moving portion 31 includes a slider moved by being guided by guide rails in the XY-directions, and a motor that drives the slider. Mounting head 32 picks up one or more components and is moved in the XY-directions by head moving portion 31. Mounting head 32 is detachably attached to the slider. One or more nozzles 33 are detachably attached to a lower surface of mounting head 32. Nozzle 33 picks up a component by using a negative pressure. Instead of nozzle 33, a pickup member that picks up a component may be a mechanical chuck or the like that mechanically holds a component.

Storage section 13 is a storage location for temporarily storing feeders 17 used in mounting device 15. Storage section 13 is provided under a conveyance device between print inspection device 12 and mounting device 15. Storage section 13 has an attachment portion provided with slots 38 and connection parts 39 similar to those of supply section 27. When feeder 17 is connected to the attachment portion, the controller of feeder 17 transmits information regarding feeder 17 to management PC 14. In storage section 13, feeder 17 may be conveyed by automatic conveyance vehicle 16, and feeder 17 may also be conveyed by an operator.

Management PC 14 is a device that manages feeder 17, stores execution data executed by loader 18, and manages loader 18. As illustrated in FIG. 1, management PC 14 includes management control section 40, memory section 42, communication section 47, display section 48, and input device 49. Display section 48 is a liquid crystal screen that displays various information. Input device 49 includes a keyboard, a mouse, and the like used for an operator to input various instructions. Management control section 40 is configured as a microprocessor centered on CPU 41 and controls the entire device. Memory section 42 stores, as information used to control loader 18, production plan information 43 including multiple pieces of mounting condition information 44, disposition state information 45 including component information 46, and the like. Mounting condition information 44 is information including mounting condition information 24 of the entire mounting system 10, and is transmitted from host PC 19 to be stored into memory section 42. Disposition state information 45 is information including disposition state information 25 of the entire mounting system 10, and includes component information 46 such as the component type and the remaining number of components of entire mounting system 10. When the attachment or detachment of feeder 17 to or from storage section 13 is performed, management PC 14 appropriately updates disposition state information 45 to the current details.

Automatic conveyance vehicle 16 automatically conveys feeder 17, a member used in mounting system 10, and the like between a warehouse (not illustrated) and storage section 13. The warehouse stores feeders 17 or other members.

Loader 18 is a mobile work device and is a device that is moved within a moving region in front of mounting system 10 (refer to a dotted line in FIG. 1) and automatically recovers and provides feeders 17 of mounting device 15. Loader 18 includes moving control section 50, memory section 53, accommodation section 54, exchange section 55, moving section 56, and communication section 57. Moving control section 50 is configured as a microprocessor centered on CPU 51 and controls the entire device. Moving control section 50 controls the entire device to recover feeder 17 from supply section 27 or provide feeder 17 to supply section 27 and to move feeder 17 to and from storage section 13. Memory section 53 is, for example, an HDD that stores various data such as a processing program. Accommodation section 54 has an accommodation space in which feeders 17 are accommodated.

Accommodation section 54 is configured to be able to accommodate, for example, four feeders 17. Exchange section 55 is a mechanism that carries feeder 17 in and out and moves feeder 17 to upper and lower stages (refer to FIG. 2). Exchange section 55 has a clamp portion that clamps feeder 17, a Y-axis slider that moves the clamp portion in the Y-axis direction (front-rear direction), and a Z-axis slider that moves the clamp portion in the Z-axis direction (upward-downward direction). Exchange section 55 performs attachment and detachment of feeder 17 in mounting attachment portion 28 and attachment and detachment of feeder 17 in buffer attachment portion 29. Moving section 56 is a mechanism that moves loader 18 in the X-axis direction (leftward-rightward direction) along X-axis rail 18a disposed in front of mounting device 15. Communication section 57 is an interface that performs exchange of information with external devices such as management PC 14 and mounting device 15. Loader 18 outputs the current position and the details of the executed work to management PC 14.

Host PC 19 (refer to FIG. 1) is configured as a server creating and managing information used by each device of mounting system 10, such as production plan information 43.

Figure 3:
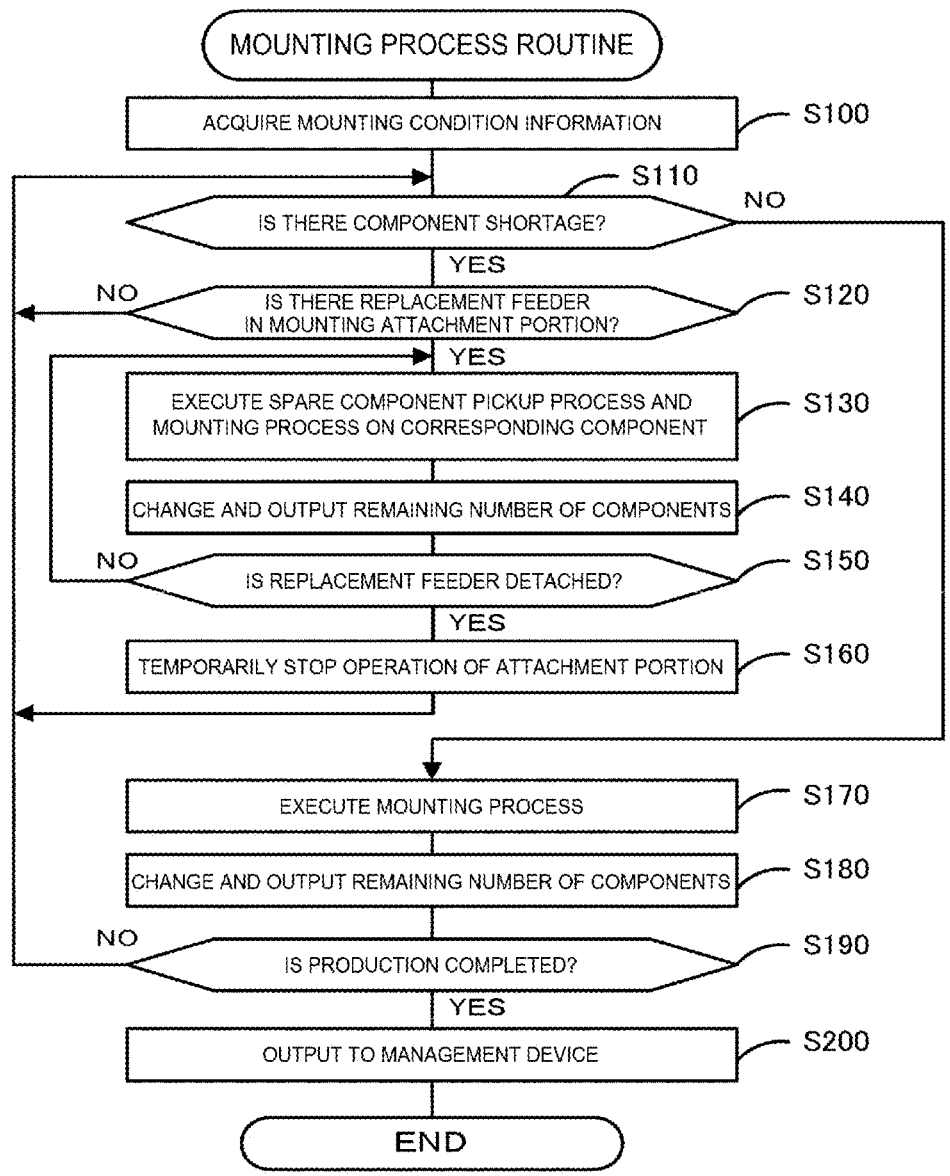
FIG. 3 is a flowchart illustrating an example of a mounting process routine.

Next, among operations of mounting system 10 of the present embodiment configured as described above, a process in which mounting device 15 mounts a component on board S will be described first. FIG. 3 is a flowchart illustrating an example of a mounting process routine executed by CPU 21 of mounting control section 20 of mounting device 15. This routine is stored in memory section 23 of mounting device 15 and executed in accordance with a start instruction from an operator. When this routine is started, first, CPU 21 reads and acquires mounting condition information of board S to be produced this time (S100). CPU 21 reads mounting condition information 24 acquired from host PC 19 and stored in memory section 23. Next, CPU 21 determines whether or not there is feeder 17 subjected to component shortage in mounting attachment portion 28 (S110). When there is no feeder 17 subjected to component shortage, CPU 21 executes a mounting process (S170). In the mounting process, CPU 21 causes mounting head 32 to pick up a component from feeder 17 at a position set in advance based on mounting condition information 24 and moves and disposes mounting head 32 to a disposition position of board S. Next, CPU 21 updates the remaining number of components of a used component, and outputs the updated number to host PC 19 or management PC 14 (S180). After S180, CPU 21 determines whether or not the production of board S is completed (S190). When the production is not completed, CPU 21 executes the processes in and after S110.

On the other hand, when there is feeder 17 subjected to component shortage is in mounting attachment portion 28 in S110, it is determined whether or not replacement feeder 17a (refer to FIG. 8) is attached to mounting attachment portion 28 that is at an irregular position not designated in mounting condition information 24 (S120). When there is replacement feeder 17a in mounting attachment portion 28 in S120, CPU 21 executes spare component pickup process for picking up a component from replacement feeder 17a attached at the position not designated in mounting condition information 24 with respect to the corresponding component, and executes a normal mounting process with respect to other components (S130). Next, CPU 21 updates the number of remaining components of the used component and outputs the updated number to host PC 19 or management PC 14 (S140). Subsequently, CPU 21 determines whether or not replacement feeder 17a attached to mounting attachment portion 28 and being subjected to the spare component pickup process is detached (S150). Since the spare component pickup process is a process of picking up a component from a position not scheduled in mounting condition information 24, in mounting device 15, loader 18 is set to move replacement feeder 17a attached at an irregular position to a position of a regular attachment portion as soon as possible. In S150, CPU 21 determines whether replacement feeder 17a is detached during the spare component pickup process. When replacement feeder 17a during the spare component pickup process is not detached, CPU 21 continues the processes in and after S130, that is, the mounting process including the spare component pickup process using replacement feeder 17a.

On the other hand, when replacement feeder 17a during the spare component pickup process is detached in S150, the operation of mounting section 30, particularly the operation of mounting head 32, is temporarily stopped (S160), and the processes in and after S110 are executed. In this case, loader 18 executes a process for detaching replacement feeder 17a, recovering feeder 17 subjected to component shortage, and attaching detached replacement feeder 17a to the recovery position. When replacement feeder 17a is attached to the regular attachment portion, CPU 21 determines in S110 that there is no feeder 17c subjected to component shortage, and executes the processes in and after S170. As described above, in mounting device 15, stopping of the mounting process is avoided as much as possible by performing the spare component pickup process using replacement feeder 17a attached to mounting attachment portion 28.

Figure 4:
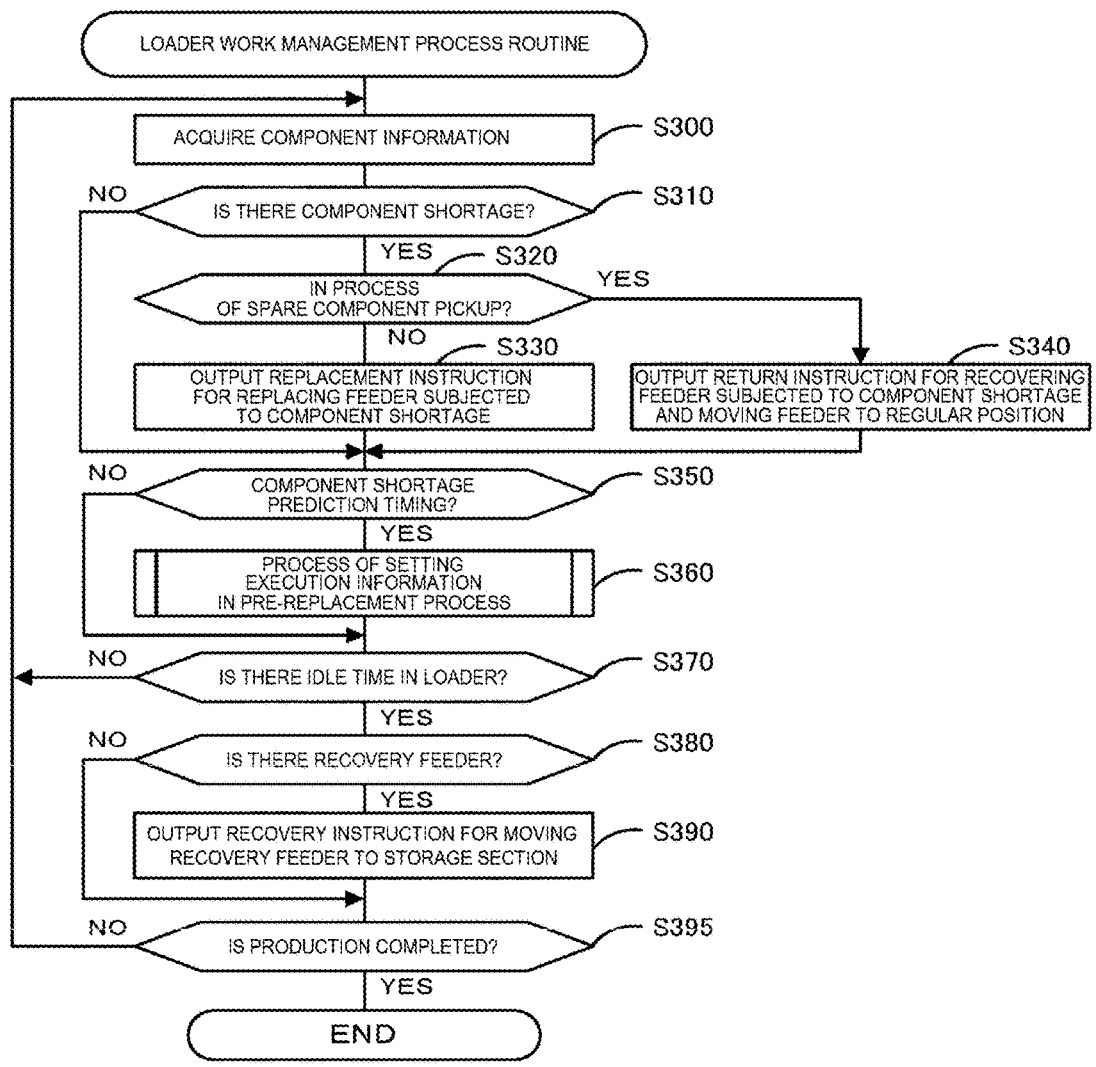
FIG. 4 is a flowchart illustrating an example of a loader work management process routine.

Next, a process of executing work management of loader 18 performed by management PC 14 will be described. Management PC 14 gives an instruction for work details to loader 18, and loader 18 executes the work in response to the instruction from management PC 14. FIG. 4 is a flowchart illustrating an example of a loader work management process routine executed by CPU 41 of management control section 40 of management PC 14. This routine is stored in memory section 42 of management PC 14 and is executed after mounting system 10 is started. When this routine is started, first, CPU 41 acquires component information 46 (S300), and determines whether or not there is feeder 17 in which component shortage has occurred (S310). When there is feeder 17 subjected to component shortage, CPU 41 determines whether or not the spare component pickup process is currently being executed (S320). When the spare component pickup process is not being executed, CPU 41 outputs a replacement instruction for replacing feeder 17 subjected to component shortage to loader 18 (S330). The replacement instruction includes a reception position of provision feeder 17 and a position of a recovery destination of detached feeder 17 subjected to component shortage. CPU 41 searches for a reception position of provision feeder 17 based on disposition state information 45, and sets a vacant attachment portion of buffer attachment portion 29 or storage section 13 as a recovery destination. On the other hand, when the spare component pickup process is being executed in S320, CPU 41 recovers feeder 17 subjected to component shortage, and outputs a return instruction for moving replacement feeder 17a to a regular position set in mounting condition information 44 to loader 18 (S340). As described above, management PC 14 controls loader 18 to preferentially replace feeder 17 subjected to component shortage.

After S330 and S340 or when there is no feeder 17 subjected to component shortage in S310, it is determined whether or not the current timing is a predetermined prediction timing for predicting whether feeder 17 subjected to component shortage is generated in the future (S350). Although the prediction timing is not particularly limited as long as the timing is a timing at which component shortage of feeder 17 can be predicted in advance and can be coped with, for example, the prediction timing may be a predetermined time (for example, 10:00 or 10:30), or may be a predetermined interval (for example, 10 minute interval or 30 minute interval) from the start of the mounting process. When the current timing is the prediction timing, CPU 41 executes a process of setting execution information in a pre-replacement process (S360). The pre-replacement process is a process of retracting pre-served feeder 17b in advance from mounting attachment portion 28 before component shortage of feeder 17 occurs, attaching replacement feeder 17a to mounting attachment portion 28 in advance, and thus allowing the spare component pickup process to be executed. The detailed process in S360 will be described later.

After S360 or when it is determined in S350 that the current timing is not the prediction timing, CPU 41 determines whether or not there is an idle time for work in loader 18 (S370). This determination may be performed based on a work schedule or the like of loader 18 set by CPU 41. When there is no free time in loader 18, CPU 41 executes the processes in and after S300. On the other hand, when there is an idle time in loader 18 in S370, CPU 41 determines whether or not recovery feeder 17 that is subjected to component shortage and is temporarily stored is present in buffer attachment portion 29 (S380). When recovery feeder 17 is present in buffer attachment portion 29, a recovery instruction for moving recovery feeder 17 to storage section 13 is output to loader 18 (S390). The recovery instruction includes a position of a reception destination of recovery feeder 17 and a position of an attachment portion of storage section 13. After S390 or when there is no recovery feeder 17 in S380, CPU 41 determines whether or not the entire production by mounting system 10 is completed (S395), and repeatedly executes the process in and after S300 when the production is not completed. On the other hand, when the production is completed, the routine is finished.

Figure 5:
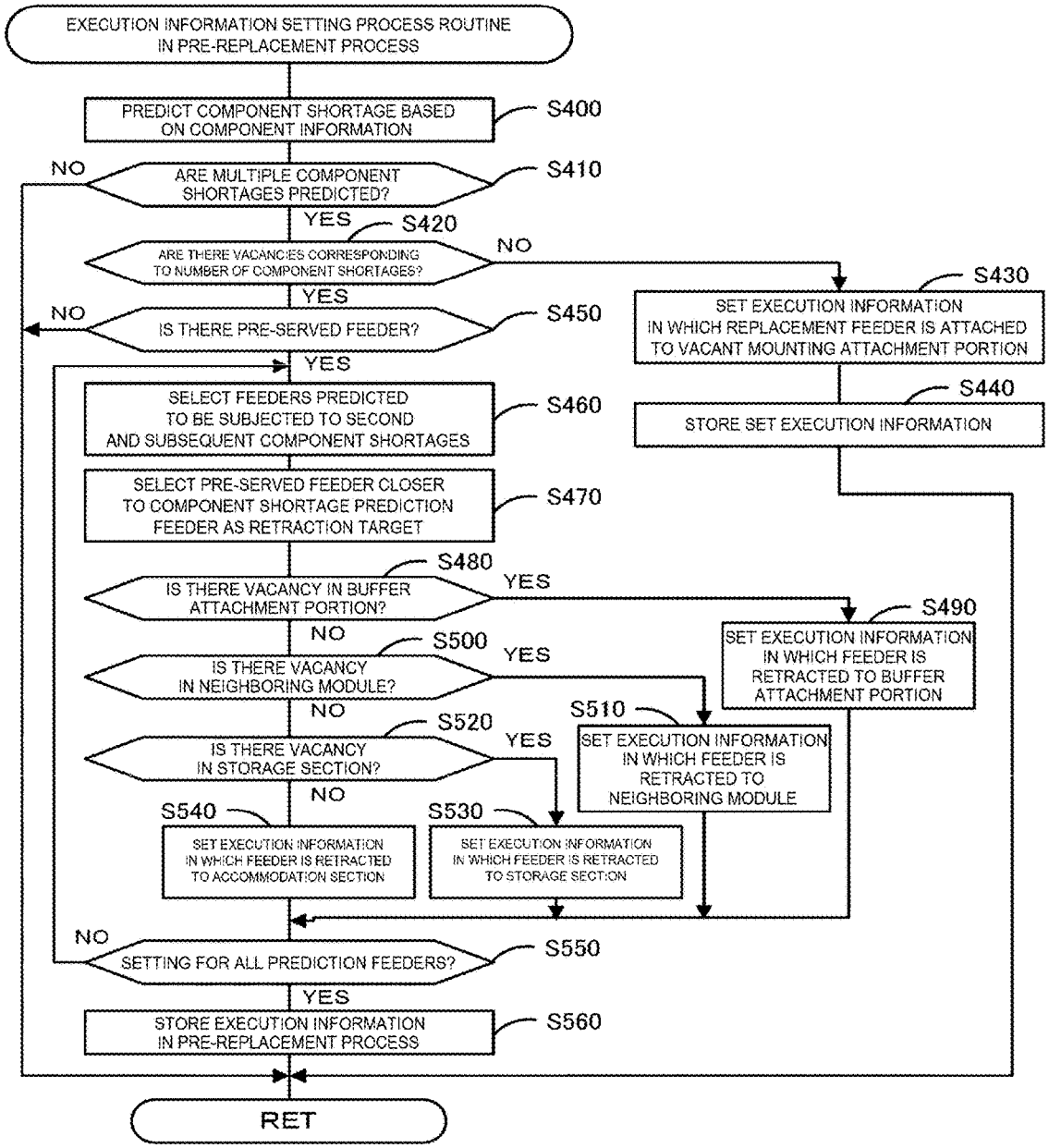
FIG. 5 is a flowchart illustrating an example of an execution information setting process routine of a pre-replacement process.

Next, a process of setting the execution information in the pre-replacement process executed in S360 will be described. FIG. 5 is a flowchart illustrating an example of an execution information setting process routine in the pre-replacement process executed by CPU 41 of management control section 40. When this routine is started, first, CPU 41 predicts component shortage of feeder 17 based on component information 46. The prediction of the component shortage may be performed, for example, by calculating a time at which the remaining number of components reaches zero based on the number of components consumed per unit time and the current number of remaining components. CPU 41 may perform the prediction of the component shortage, for example, in a period before the prediction of the next component shortage, may perform the prediction in only an execution period of the current production job, or may perform the prediction over multiple production jobs. In mounting device 15, since the time of component shortage may change depending on a component pickup error or the like, an appropriate prediction period may be set based on experience.

Next, in S410, CPU 41 determines whether or not multiple component shortages are expected to occur within a specific predetermined period. The predetermined period may be determined, for example, based on the work time of loader 18, and may be, for example, 5 minutes or 10 minutes. FIG. 6 is an explanatory diagram illustrating an example of a production status related to prediction of component shortage, FIG. 6A illustrates an example of mounting attachment portion 28, and FIG. 6B illustrates an example of buffer attachment portion 29. FIG. 6 illustrates a relationship between elapse of a predetermined period and feeder 17 attached to an attachment portion at that time. FIG. 6 illustrates an example of mounting attachment portion 28 in which the predetermined period is determined to be 10 minutes and the number of attachment portions is ten. In FIG. 6, feeder 17 used for replacement due to component shortage is indicated by hatching, and a component type of feeder 17 is indicated by "P01" or the like. In the example illustrated in FIG. 6, in S410, it is predicted that component shortages occur in three feeders 17 of P01, P03, and P04 for 10 minutes from 00:20, and a component shortage occurs in feeder 17 of P06 for 10 minutes from 00:40. In a case where multiple component shortages are not predicted within a specific predetermined period, CPU 41 finishes this routine without setting execution information. That is, in mounting device 15, feeder 17 in which the component shortage has occurred is directly replaced by loader 18 without performing the spare component pickup process.

On the other hand, when multiple component shortage are predicted within a specific predetermined period in S410, CPU 41 determines whether or not vacancies corresponding to the number of component shortages predicted within the specific predetermined period are present in mounting attachment portion 28 (S420). When vacancies corresponding to the predicted number of component shortages within the specific predetermined period are present in mounting attachment portion 28, CPU 41 sets execution information for attaching replacement feeder 17a to a vacant attachment portion before the specific predetermined period (S430), stores the set execution information into memory section 53 (S440), and finishes the routine. In this case, moving control section 50 of loader 18 attaches replacement feeder 17a to vacant mounting attachment portion 28 based on the execution information at the set timing.

On the other hand, in S420, when vacancies corresponding to the predicted number of component shortage within the specific predetermined period are not present in mounting attachment portion 28, it is determined whether or not there is pre-served feeder 17b in mounting attachment portion 28 within the specific predetermined period (S450). When there is no pre-served feeder 17b, it is determined that replacement feeder 17a cannot be subjected to the pre-replacement process, and the routine is finished without any change. On the other hand, when there is pre-served feeder 17b in mounting attachment portion 28, CPU 41 selects one of feeders 17c predicted to be subjected to the next and subsequent (second and subsequent) component shortages following a first predicted component shortage as a setting process target (S460). Next, in S470, CPU 41 selects pre-served feeder 17b closer to the selected prediction feeder 17c as a retraction target.

Next, CPU 41 determines a retraction destination of pre-served feeder 17b (S480 to S550). Specifically, first, CPU 41 determines whether or not there is a vacancy in buffer attachment portion 29 (S480), and, when there is a vacancy, sets execution information for retracting pre-served feeder 17b to buffer attachment portion 29 (S490). On the other hand, when there is no vacancy in buffer attachment portion 29 in S480, CPU 41 determines whether or not there is a vacancy in a neighboring module of supply section 27 (S500), and, when there is a vacancy in the neighboring module, sets execution information for retracting pre-served feeder 17b to the module (S510). On the other hand, when there is no vacancy in the neighboring module in S500, CPU 41 determines whether or not there is a vacancy in storage section 13 (S520), and, when there is a vacancy, sets execution information for retracting pre-served feeder 17b to storage section 13 (S530). On the other hand, when there is no vacancy in storage section 13, CPU 41 sets execution information for to be temporarily storing pre-served feeder 17b into accommodation section 54 of loader 18 (S540). After S490, S510, S530, and S540, CPU 41 determines whether or not execution information is set for all prediction feeders 17c (S550), and executes the processes in and after S460 when execution information is not set for all prediction feeders 17c. That is, in S460, the next prediction feeder 17c for which the execution information is not set is selected, and a process of setting a retraction destination of pre-served feeder 17b is executed for this prediction feeder 17c.

On the other hand, when the execution information is set for all prediction feeders 17c in S550, CPU 41 stores the set execution information in the pre-replacement process into memory section 53 (S560), and finishes the routine. In this case, moving control section 50 of loader 18 retracts pre-served feeder 17b to the retraction destination based on the execution information at the set timing, and attaches replacement feeder 17a to vacant mounting attachment portion 28 caused by the retraction. Even in a case where multiple component shortages occur in feeder 17, since replacement feeder 17a is attached to mounting attachment portion 28, CPU 21 of mounting device 15 can execute the spare component pickup process and can continue the mounting process.

Figure 7:
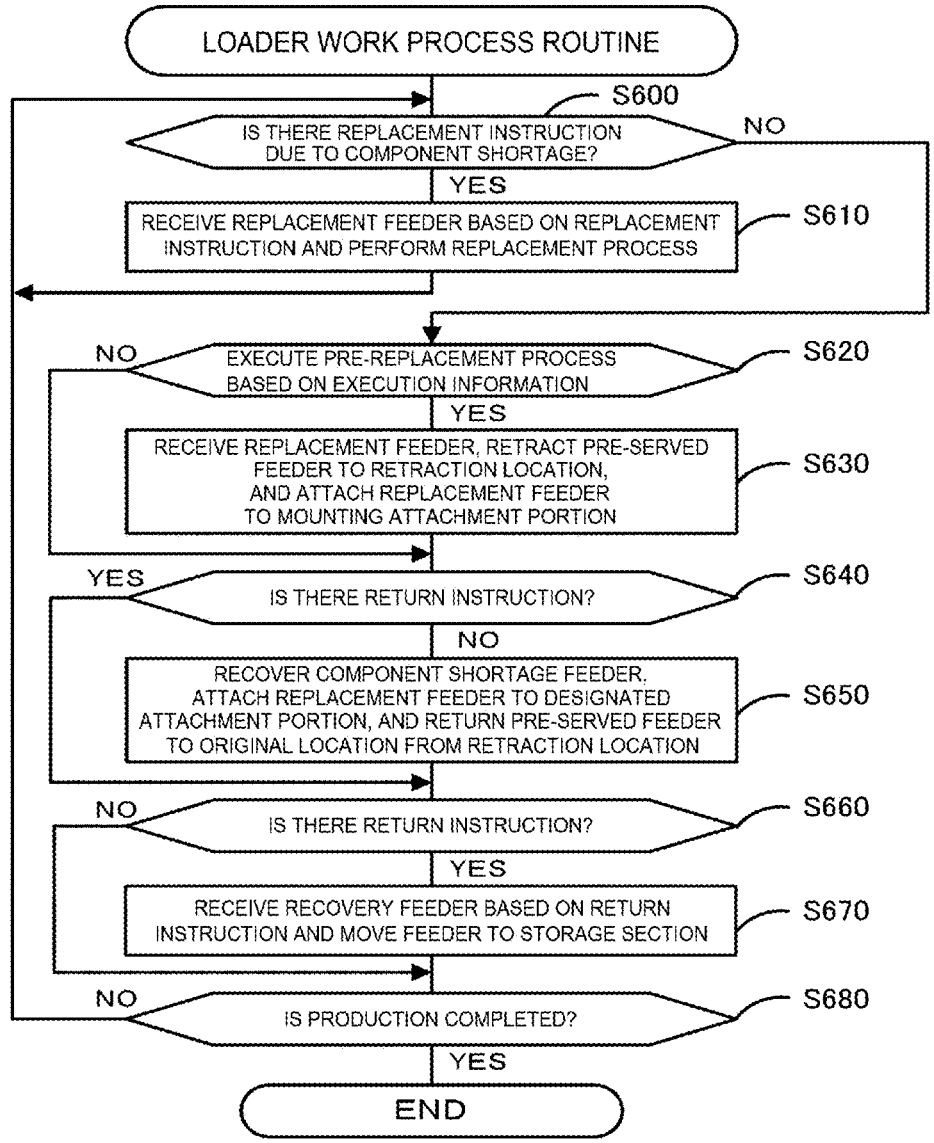
FIG. 7 is a flowchart illustrating an example of a loader work process routine.

Next, a work process executed by loader 18 that has acquired various instructions from management PC 14 will be described. FIG. 7 is a flowchart illustrating an example of a loader work process routine executed by CPU 51 of moving control section 50 included in loader 18. This routine is stored in memory section 53 of loader 18 and is executed after loader 18 is started. When this routine is started, CPU 51 determines whether or not there is a replacement instruction based on the component shortage (S600), and, when there is a replacement instruction, executes a replacement process of receiving replacement feeder 17a and replacing replacement feeder 17 with feeder 17 subjected to component shortage based on the replacement instruction (S610), and executes the processes in and after S600. Loader 18 preferentially processes the replacement instruction. On the other hand, when there is no replacement instruction in S600, CPU 51 determines whether or not to execute a pre-replacement process based on execution information (S620). The execution information defines a predetermined period before the component shortage occurs as an execution start timing, and CPU 51 starts the pre-replacement process when the execution start timing is reached. When it is determined that the pre-replacement process is to be executed, CPU 51 executes the pre-replacement process of receiving replacement feeder 17a, retracting pre-served feeder 17b to a retraction location, and attaching replacement feeder 17a to mounting attachment portion 28 that is vacant due to the retraction, based on the execution information (S630).

Figure 8A:
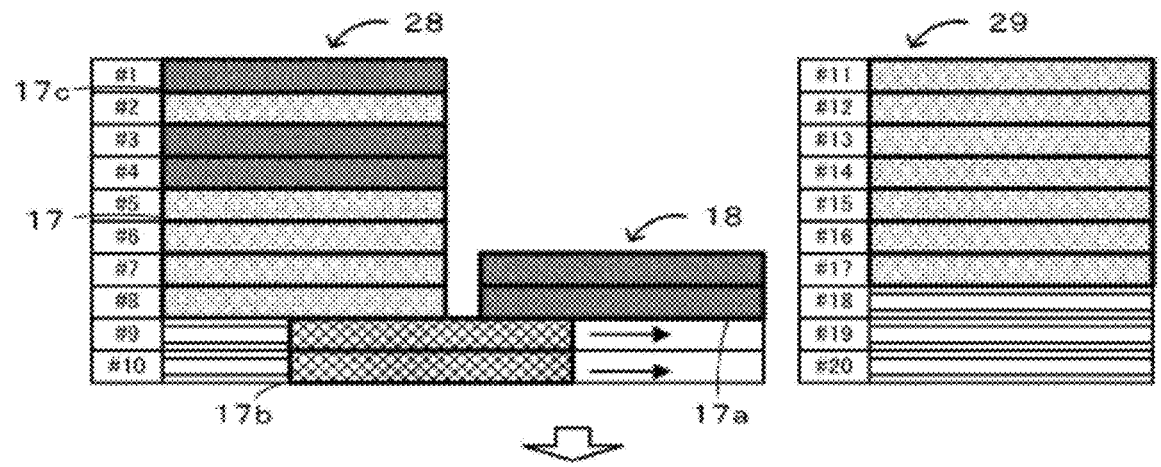
FIG. 8 is an explanatory diagram illustrating an example of work of retracting pre-served feeder 17b.
Figure 8B:
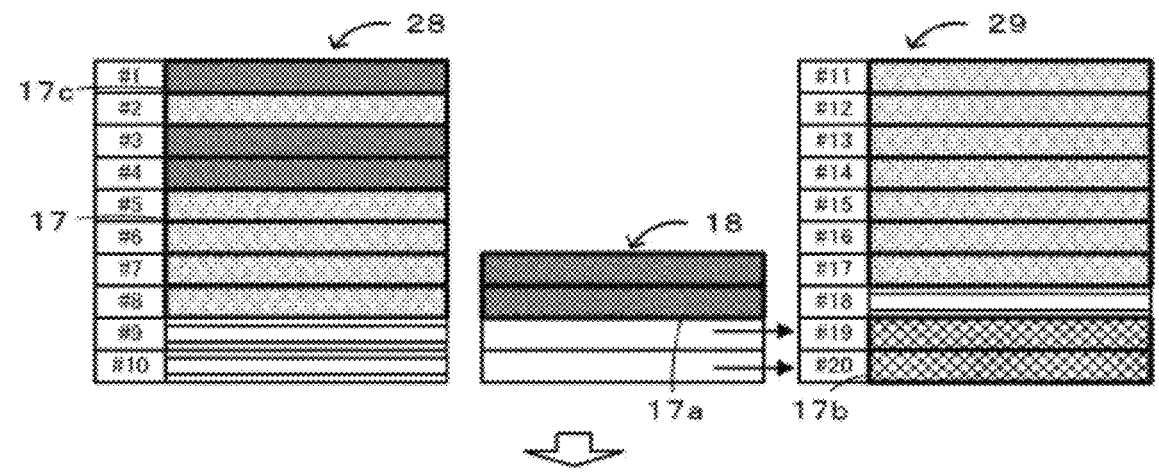
Figure 8C:
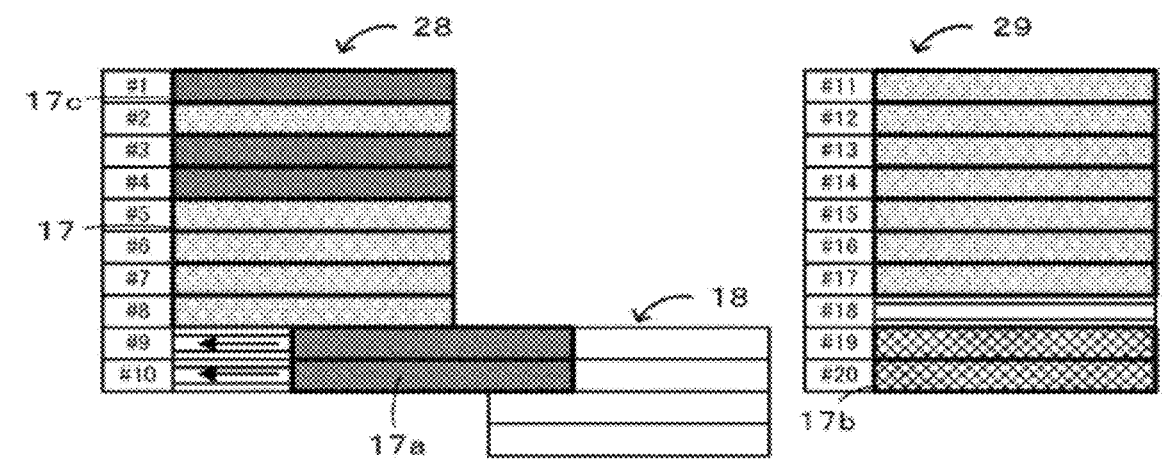

FIG. 8 is an explanatory diagram illustrating an example of work in which loader 18 retracts pre-served feeder 17b, FIG. 8A illustrates accommodation of pre-served feeder 17b in loader 18, FIG. 8B illustrates retraction to buffer attachment portion 29, and FIG. 8C illustrates attachment of replacement feeder 17a to mounting attachment portion 28. FIG. 8 corresponds to a state of the attachment portion in FIG. 6. When reaching 00:10 before the component shortage illustrated in FIG. 6 occurs, CPU 51 starts a pre-replacement process, and transports replacement feeders 17a corresponding to #3 and #4 from storage section 13. Next, CPU 51 moves two pre-served feeders 17b to buffer attachment portion 29 after pre-served feeders 17b are temporarily accommodated in #9 and #10 (FIGS. 8A and 8B). CPU 51 attaches replacement feeders 17a to the vacant attachment portions of #9 and #10 (FIG. 8C). Such a process is performed, and thus mounting device 15 can execute the spare component pickup process using replacement feeders 17a.

After S630 or when the pre-replacement process is not executed in S620, CPU 51 determines whether or not a return instruction has been acquired from management PC 14 (S640). When the return instruction has been acquired, CPU 51 executes a process of recovering feeder 17 subjected to component shortage attached to mounting attachment portion 28, attaching replacement feeder 17a used for the spare component pickup process to mounting attachment portion 28 that is vacant due to the recovery, and returning pre-served feeder 17b that has been retracted in advance from the retraction location to original mounting attachment portion 28 (S650). After S650 or when there is no return instruction in S640, CPU 51 determines whether or not there is a recovery instruction (S660). When there is a recovery instruction, CPU 51 executes a recovery process of receiving feeder 17 subjected to component shortage temporarily stored in buffer attachment portion 29 based on the recovery instruction and moving feeder 17 to storage section 13 (S670). On the other hand, after S670 or when there is no recovery instruction in S660, CPU 51 determines whether or not the production of board S is completed (S680), and executes the processes in and after S600 when the production of board S is not completed. On the other hand, when the production of board S is completed in S680, the routine is finished.

Here, a correspondence relationship between the constituent elements of the present embodiment and the constituent elements of the present disclosure will be clarified. Mounting device 15 of the present embodiment corresponds to a mounting device, management PC 14 corresponds to a management device, and loader 18 corresponds to a mobile work device. Management control section 40 corresponds to a management control section, supply section 27 corresponds to a supply section, mounting attachment portion 28 and buffer attachment portion 29 correspond to an attachment portion, mounting section 30 corresponds to a mounting section, and mounting control section 20 corresponds to a mounting control section. Board S corresponds to a mounting target. In the present embodiment, an example of a management method of the present disclosure is also clarified by describing the operation of management control section 40.

In management PC 14 described above, when component shortage of feeder 17 attached to mounting attachment portion 28 is predicted, and mounting attachment portion 28 is in a predetermined serving state in which pre-served feeder 17b used in the next and subsequent productions is attached to a part of mounting attachment portion 28 without no vacancy in mounting attachment portion 28, loader 18 executes the pre-replacement process of detaching pre-served feeder 17b from mounting attachment portion 28 before the component shortage of feeder 17, and attaching replacement feeder 17a corresponding to feeder 17c predicted to be subjected to the component shortage to mounting attachment portion 28 from which pre-served feeder 17b is detached. In mounting device 15, since replacement feeder 17a is attached to mounting attachment portion 28 due to the pre-replacement process, even when the component shortage of feeder 17 occurs, the mounting process can be continued by executing the spare component pickup process of causing mounting section 30 to pick up a component from replacement feeder 17a attached to mounting attachment portion 28 at a position not designated in mounting condition information 24. Therefore, management PC 14 can efficiently execute the mounting process when the replacement of feeder 17 is required.

When mounting attachment portion 28 is in the predetermined serving state and two or more feeders 17 are predicted to be subjected to component shortages within a predetermined period, management control section 40 causes loader 18 to execute the pre-replacement process on feeders 17 predicted to be subjected to the component shortage following a feeder predicted to be subjected to a first component shortage before the component shortage. In management PC 14, in a case where multiple feeders 17 are predicted to be subjected to component shortages, it is possible to execute the spare component pickup process by using feeders 17c predicted to be subjected to the second and subsequent component shortages. In this case, management control section 40 causes loader 18 to directly replace prediction feeder 17c predicted to be subjected to the first component shortage with feeder 17 after the component shortage occurs. For example, in a case where the spare component pickup process is executed, it is necessary thereafter to move feeder 17 to a set position, but it is preferable that the cycle time balance of the mounting process is hardly collapsed since such movement of feeder 17 does not occur when the direct replacement is performed.

Since management control section 40 retracts pre-served feeder 17b detached from mounting attachment portion 28 to buffer attachment portion 29, this is preferable because the moving time is short when pre-served feeder 17b is returned to the original state. In order to retract pre-served feeder 17b detached from mounting attachment portion 28 to an attachment portion of a module closer to a detachment module, management control section 40 can shorten the moving time of feeder 17 as much as possible by retracting pre-served feeder 17b to as close a retraction location as possible. Management control section 40 retracts pre-served feeder 17b detached from mounting attachment portion 28 to storage section 13 that temporarily stores provision feeder 17 to be provided to supply section 27 and recovery feeder 17 recovered from supply section 27. Therefore, management control section 40 can more reliably retract pre-served feeder 17b. Since management control section 40 retracts pre-served feeder 17b detached from mounting attachment portion 28 to accommodation section 54 of loader 18 to be temporarily stored in accommodation section 54, it is possible to more reliably retract pre-served feeder 17b. Management control section 40 determines a retraction destination to which pre-served feeder 17b is to be retracted based on the priority orders of buffer attachment portion 29, an attachment portion of a module closer to a module from which pre-served feeder 17b is detached, storage section 13, and accommodation section 54. In management PC 14, since pre-served feeder 17b is retracted to a retraction location as close as possible to original mounting attachment portion 28, it is possible to further reduce a process time for returning to the original position.

Since management control section 40 selects pre-served feeder 17b closer to prediction feeder 17c predicted to be subjected to component shortage as a retraction target to be detached from mounting attachment portion 28, replacement feeder 17a is attached thereto and is closer to a regular position, and thus it is possible to suppress an increase in a moving distance of mounting head 32, and it is possible to further suppress an increase in a mounting process time. Management control section 40 acquires component information 46 as information regarding the current production status at a predetermined component shortage prediction timing during the mounting process, performs component shortage prediction of feeder 17 based on the acquired information, and sets execution information in the pre-replacement process. In management PC 14, since the pre-replacement process can be scheduled at a timing during the execution of the mounting process, even in a case where, for example, a deviation occurs in the component shortage timing due to a pickup error or the like, a more accurate component shortage timing can be derived by sequentially performing the component shortage prediction, and thus the mounting process can be efficiently executed. After the component shortage occurs in prediction feeder 17c predicted to be subjected to component shortage, management control section 40 causes loader 18 to replace replacement feeder 17a subjected to the pre-replacement process with feeder 17 subjected to component shortage and to move pre-served feeder 17b that has been retracted to mounting attachment portion 28. In management PC 14, since pre-served feeder 17b is attached to mounting attachment portion 28 after the feeder subjected to component shortage is replaced, it is possible to prepare for a setup change process. Management control section 40 can perform the mounting process in a proper state in order to move replaced recovery feeder 17 subjected to component shortage to storage section 13 after pre-served feeder 17b is moved to mounting attachment portion 28 when loader 18 has a time margin.

In loader 18, similarly to management PC 14 described above, it is possible to efficiently execute the mounting process when feeder 17 is required to be replaced. In mounting system 10, similarly to management PC 14 described above, it is possible to efficiently execute the mounting process when feeder 17 is required to be replaced. Mounting system 10 includes management PC 14, loader 18, and mounting device 15 described above and can thus execute replacement of feeder 17 more efficiently.

It is obvious that the present disclosure is not limited to the above-described embodiment and can be implemented in various aspects as long as the aspects belong to the scope of the present disclosure.

For example, in the above embodiment, when two or more feeders 17 are predicted to be subjected to component shortages within a predetermined period, the pre-replacement process is performed on the second and subsequent feeders predicted to be subjected to component shortage; however, the configuration is not particularly limited to this, and the pre-replacement process may also be performed on first prediction feeder 17c. In mounting system 10, since the spare component pickup process can be executed even in a case where feeder 17 subjected to a first component shortage is not replaced by loader 18 in time, the mounting process can be continued without stopping the process. The pre-replacement process is executed in a case where two or more component shortages are predicted within a predetermined period;

however, the configuration is not particularly limited to this, and the pre-replacement process may be executed even when one component shortage is predicted within the predetermined period. In mounting system 10, since the spare component pickup process can be executed even in a case where the replacement of feeder 17 subjected to component shortage is not performed in time by loader 18, the mounting process can be continued without stopping the process.

In the above embodiment, a retraction destination of pre-served feeder 17b is buffer attachment portion 29, the neighboring module, storage section 13, accommodation section 54 of loader 18, or the like, but one or more of these may be omitted, or an retraction destination other than these may be added. In the above embodiment, a retraction destination is determined in a priority order; however, the configuration is not particularly limited to this, and the priority order may be changed, or the priority order may be omitted. Also in this mounting system 10, since replacement feeder 17a is attached to mounting attachment portion 28 through the pre-replacement process, the mounting process can be continued by executing the spare component pickup process even when component shortage occurs in feeder 17.

In the above embodiment, a retraction target is a pre-served feeder closer to a feeder predicted to be subjected to component shortage; however, the configuration is not particularly limited to this. For example, management PC 14 may set a pre-served feeder used for production later than other feeders as a retraction target. In this case, it is preferable that there is little influence when the pre-served feeder is retracted. Management PC 14 may set, as a retraction target, a pre-served feeder or the like located on the end side excluding a feeder currently used for production and a replacement feeder to be subjected to a pre-replacement process. In this case, it is easy to recognize the retraction target.

In the above embodiment, management PC 14 performs the process of setting the execution information in the pre-replacement process by predicting component shortage of feeder 17; however, the configuration is not particularly limited to this, and host PC 19 may perform this process, or other devices such as mounting device 15 may have this function. Also in this mounting system 10, since replacement feeder 17a is attached to mounting attachment portion 28 through the pre-replacement process, the mounting process can be continued by executing the spare component pickup process even when component shortage occurs in feeder 17.

Figure 9:
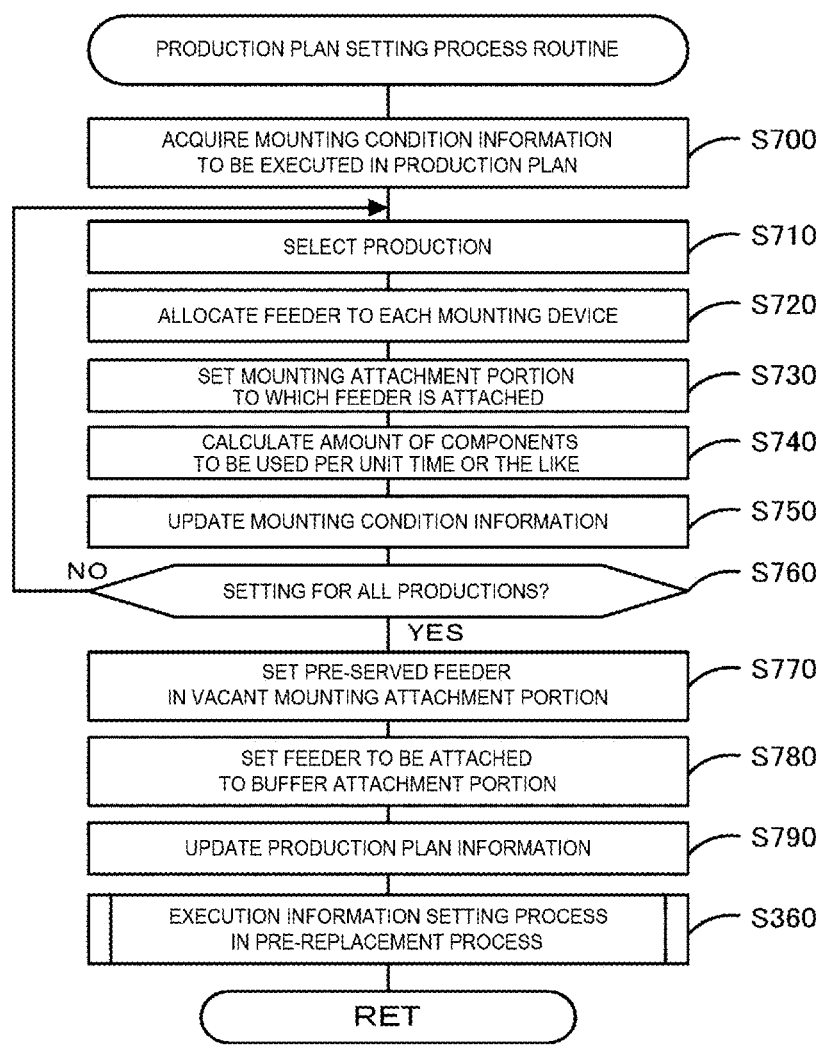
FIG. 9 is a flowchart illustrating an example of a production plan setting process routine.

In the above embodiment, the process of setting the execution information in the pre-replacement process is performed by predicting component shortage at a predetermined prediction timing; however, the configuration is not particularly limited to this. For example, host PC 19 may predict component shortage of feeder 17 when production plan information 43 including multiple pieces of mounting condition information 44 is created based on information regarding feeder 17 to be used and information regarding the use of a component (component information 46 or the like), and may set the execution information in the pre-replacement process. FIG. 9 is a flowchart illustrating an example of a production plan setting process routine executed by the CPU of host PC 19. This routine is stored in the memory section of host PC 19 and is executed when a production plan is created. When this routine is started, the CPU of host PC 19 acquires mounting condition information to be executed in the production plan (S700). Although components to be used are set in the mounting condition information, conditions such as disposition of feeders 17 are not yet set. Next, the CPU selects production of a setting target (S710), and executes allocation of feeder 17 to each mounting device 15 (S720). The allocation of feeder 17 is performed such that a work time of each device is made more uniform. Next, the CPU sets mounting attachment portion 28 to which feeder 17 is attached such that a moving time of mounting head 32 at the time of mounting is shortened (S730). Next, the CPU calculates information regarding the mounting process such as the number of consumed components per unit time or a manufacturing time when single board S is manufactured based on parameters such as a moving distance or a moving speed of mounting head 32 (S740). Subsequently, the CPU updates the mounting condition information including the disposition or the calculated result of set feeders 17 (S750). The CPU determines whether or not the above-described setting has been performed for all the productions (S760), and executes the processes in and after S710 when the setting has not been completed for all the productions. On the other hand, when the above-described setting has been completed for all the productions, the CPU sets pre-served feeder 17b in vacant mounting attachment portion 28 (S770), sets feeder 17 to be attached to buffer attachment portion 29 (S780), and updates the production plan information (S790). Host PC 19 reduces a time period, for example, during a setup change by attaching feeder 17 to mounting attachment portion 28 or buffer attachment portion 29 as much as possible. The CPU performs an execution information setting process in the pre-replacement process in the same manner as in S360 (S400 to S560), sets the execution information in advance, and finishes the routine. The CPU predicts component shortages of all feeders 17 based on the number of components of feeder 17 to be used, the number of components consumed per unit time, and the like, and sets the execution information. Even in this manner, since replacement feeder 17a is attached to mounting attachment portion 28 through the pre-replacement process, the mounting process can be continued by executing the spare component pickup process even when component shortage occurs in feeder 17.

In the above embodiment, the present disclosure is applied to the forms of mounting system 10, management PC 14, and loader 18, but the present disclosure may be applied to a management method, and a program causing a computer to execute respective steps of the management method.

Here, the management device, the mobile work device, the mounting system, and the management method of the present disclosure may be configured as follows. For example, in the management device of the present disclosure, when the mounting attachment portion is in the predetermined serving state and two or more feeders are predicted to be subjected to component shortages within the predetermined period, the management control section may cause the mobile work device to execute the pre-replacement process on a feeder predicted to be subjected to a component shortage following a feeder predicted to be subjected to a first component shortage before the component shortage of the feeder. In the management device, in a case where multiple feeders are predicted to be subjected to component shortages, it is possible to execute the spare component pickup process by using feeders predicted to be subjected to the second and subsequent component shortages. In this case, management control section may cause the mobile work device to replace the feeder predicted to be subjected to the first component shortage after the component shortage occurs. In a case where the spare component pickup process is executed, it is necessary to thereafter move the feeder to a set position, but it is preferable that the cycle time balance of the mounting process is hardly collapsed since such moving of the feeder does not occur when the direct replacement is performed.

The management device of the present disclosure may execute any one or more of the following (1) to (4). In this management device, the pre-served feeder can be retracted to any of retraction locations employed below. In the mounting system, it is preferable from the viewpoint of a moving time that a pre-served feeder is disposed in a retraction location closer to a position where the pre-served feeder is detached. (1) The attachment portion further includes a buffer attachment portion from which the mounting section cannot pick up the component, and the management control section retracts the pre-served feeder detached from the mounting attachment portion to the buffer attachment portion. (2) The mounting system has multiple modules including the attachment portion, and the management control section retracts the pre-served feeder detached from the mounting attachment portion to an attachment portion of a module closer to a detachment module. (3) The mounting system includes a storage section provided in a production line configured by the mounting device and temporarily storing a provision feeder to be provided to the supply section and a recovery feeder recovered from the supply section, and the management control section retracts the pre-served feeder detached from the mounting attachment portion to the storage section. (4) The management control section retracts the pre-served feeder detached from the mounting attachment portion to the accommodation section and temporarily stores the pre-served feeder in the accommodation section.

In the management device of the present disclosure that retracts the pre-served feeder to the predetermined retraction location, the management control section may determine a retraction destination to which the pre-served feeder is retracted based on a priority order of the temporary storage in the buffer attachment portion, the attachment portion of the module closer to the module from which the pre-served feeder is detached, the storage section, and the accommodation section. In this management device, since the pre-served feeder is retracted to a retraction location as close as possible to the original mounting attachment portion, it is possible to further reduce a process time for returning to the original position. In this case, the management control section may select a retraction location having the next priority order when there is no vacancy in a retraction location having a higher priority order. In this management device, the temporary storage in one or more of the buffer attachment portion, the attachment portion of the module closer to the module from which the pre-served feeder is detached, the storage section, and the accommodation section may be omitted, or other retraction locations may be added.

The management device of the present disclosure may execute any one or more of the following (5) to (7). In this management device, it is possible to efficiently execute the mounting process by retracting any of the pre-served feeders employed below. (5) The management control section causes the mobile work device to detach the pre-served feeder closer to the feeder predicted to be subjected to a component shortage from the mounting attachment portion. (6) The management control section causes the mobile work device to detach the pre-served feeder used for production later than other feeders from the mounting attachment portion. (7) The management control section causes the mobile work device to sequentially detach feeders from the pre-served feeder located on the end side excluding the feeder currently used for production and the replacement feeder to be subjected to the pre-replacement process, from the mounting attachment portion.

The management device of the present disclosure may execute any one or more of the following (8) and (9). In this management device, it is possible to schedule the pre-replacement process at any of the following employed timings, and thus to efficiently execute the mounting process. (8) The management control section acquires information regarding the current production status at a predetermined timing during the mounting process, predicts a component shortage of the feeder based on the acquired information regarding the production status, and sets the execution information in the pre-replacement process. (9) The management control section predicts a component shortage of the feeder when a production plan including multiple pieces of mounting condition information is created based on information regarding a feeder to be used and information regarding the use of a component, and sets the execution information in the pre-replacement process.

In the management device of the present disclosure, the management control section may cause the mobile work device to replace a feeder predicted to be subjected to the component shortage with the replacement feeder that has been subjected to the pre-replacement process after the component shortage occurs in the feeder, and to move the retracted pre-served feeder to the mounting attachment portion. In this management device, since the pre-served feeder is attached to the mounting attachment portion after the feeder subjected to the component shortage is replaced, it is possible to prepare for the setup change process. The management control section may move the replaced feeder subjected to the component shortage to the storage section after moving the pre-served feeder to the mounting attachment portion.

The mobile work device of the present disclosure may be a device used in a mounting system provided with a mounting device including a mounting section configured to mount a component on a mounting target, a supply section configured to attach a feeder holding the component to an attachment portion having multiple mounting attachment portions from which the mounting section is capable of picking up the component, and a mounting control section configured to cause the mounting section to pick up the component from the feeder at a position designated in mounting condition information, while cause the mounting section to execute a spare component pickup process of picking up the component from a replacement feeder attached to a mounting attachment portion at a position not designated in the mounting condition information when a component shortage occurs in the feeder, the mobile work device including an accommodation section configured to accommodate the feeder; and a moving control section configured to recover the feeder from the supply section and/or attach the feeder to the supply section and move the feeder, and execute a pre-replacement process of detaching a pre-served feeder from the mounting attachment portion before the component shortage of the feeder and attaching a replacement feeder, corresponding to the feeder predicted to be subjected to the component shortage, to the mounting attachment portion from which the pre-served feeder is detached when the feeder attached to the mounting attachment portion is predicted to be subjected to the component shortage while the mounting attachment portion is in a predetermined serving state such that there is no vacancy in the mounting attachment portion and the pre-served feeder to be used in the next and subsequent productions is attached to a part of the mounting attachment portion.

In this mobile work device, similarly to the management device described above, in the mounting device, since the replacement feeder is attached to the mounting attachment portion through the pre-replacement process, the mounting process can be continued by executing the spare component pickup process even when the component shortage occurs in the feeder. Therefore, in the mobile work device, it is possible to efficiently execute the mounting process when the feeder is required to be replaced. In the mobile work device, a configuration for realizing each function of the management device described above may be added, or a process of realizing each function of the management device described above may be added.

A mounting system of the present disclosure includes any one of the above management devices; a mounting device including a mounting section configured to mount a component on a mounting target, a supply section configured to attach a feeder holding the component to an attachment portion having multiple mounting attachment portions from which the mounting section is capable of picking up the component, and a mounting control section configured to cause the mounting section to pick up the component from the feeder at a position designated in mounting condition information, while cause the mounting section to execute a spare component pickup process of picking up the component from a replacement feeder attached to a mounting attachment portion at a position not designated in the mounting condition information when a component shortage occurs in the feeder; and a mobile work device including an accommodation section configured to accommodate the feeder, and a moving control section configured to recover the feeder from the supply section and/or attach the feeder to the supply section and move the feeder.

In this mounting system, similarly to the management device described above, in the mounting device, since the replacement feeder is attached to the mounting attachment portion through the pre-replacement process, the mounting process can be continued by executing the spare component pickup process even when the component shortage occurs in the feeder. Therefore, in this mounting system, it is possible to efficiently execute the mounting process when the feeder is required to be replaced.

A management method of the present disclosure is a method used in a mounting system provided with a mounting device including a mounting section configured to mount a component on a mounting target, a supply section configured to attach a feeder holding the component to an attachment portion having multiple mounting attachment portions from which the mounting section is capable of picking up the component, and a mounting control section configured to cause the mounting section to pick up the component from the feeder at a position designated in mounting condition information, while cause the mounting section to execute a spare component pickup process of picking up the component from a replacement feeder attached to a mounting attachment portion at a position not designated in the mounting condition information when a component shortage occurs in the feeder, and a mobile work device including an accommodation section configured to accommodate the feeder, and a moving control section configured to recover the feeder from the supply section and/or attach the feeder to the supply section and move the feeder, the management method including a step of causing the mobile work device to execute a pre-replacement process of detaching a pre-served feeder from the mounting attachment portion before the component shortage of the feeder and attaching a replacement feeder, corresponding to the feeder predicted to be subjected to the component shortage, to the mounting attachment portion from which the pre-served feeder is detached when the feeder attached to the mounting attachment portion is predicted to be subjected to the component shortage while the mounting attachment portion is in a predetermined serving state such that there is no vacancy in the mounting attachment portion and the pre-served feeder to be used in the next and subsequent productions is attached to a part of the mounting attachment portion.

In this management method, similarly to the management device described above, since the replacement feeder is attached to the mounting attachment portion through the pre-replacement process in the mounting device, the mounting process can be continued by executing the spare component pickup process even when the component shortage occurs in the feeder. Therefore, in this management method, it is possible to efficiently execute the mounting process when the feeder is required to be replaced. In the management method, various aspects of the management device described above may be employed, or steps for realizing each function of the management device described above may be added.

INDUSTRIAL APPLICABILITY

The present disclosure is applicable to the technical field of devices that pick up and mount components.

REFERENCE SIGNS LIST

10 Mounting system, 11 Printing device, 12 Print inspection device, 13 Storage section, 14 Management PC, 15 Mounting device, 16 Automatic conveyance vehicle, 17 Feeder, 17a Replacement feeder, 17b Pre-served feeder, 17c Prediction feeder, 18 Loader, 18a X-axis rail, 19 Host PC, 20 Mounting control section, 21 CPU, 23 Memory section, 24 Mounting condition information, 25 Disposition state information, 26 Board processing section, 27 Supply section, 28 Mounting attachment portion, 29 Buffer attachment portion, 30 Mounting section, 31 Head moving portion, 32 mounting head, 33 nozzle, 35 Communication section, 38 Slot, 39 Connection part, 40 Management control section, 41 CPU, 42 Memory section, 43 Production plan information, 44 Mounting condition information, 45 Disposition state information, 46 Component information, 47 Communication section, 48 Display section, 49 Input device, 50 Moving control section, 51 CPU, 53 Memory section, 54 Accommodation section, 55 Exchange section, 56 Moving section, 57 Communication section, S Board

The invention claimed is:

1. A management device used in a mounting system provided with a mounting device including a mounting section configured to mount a component on a mounting target, a supply section configured to attach a feeder holding the component to an attachment portion having multiple mounting attachment portions from which the mounting section is capable of picking up the component, and a mounting control section configured to cause the mounting section to pick up the component from the feeder at a position designated in mounting condition information, while cause the mounting section to execute a spare component pickup process of picking up the component from a replacement feeder attached to a mounting attachment portion at a position not designated in the mounting condition information when a component shortage occurs in the feeder, and a mobile work device including an accommodation section configured to accommodate the feeder, and a moving control section configured to recover the feeder from the supply section and/or attach the feeder to the supply section and move the feeder, the management device comprising:

a management control section configured to cause the mobile work device to execute a pre-replacement process of detaching a pre-served feeder from the mounting attachment portion before the component shortage of the feeder and attaching a replacement feeder, corresponding to the feeder predicted to be subjected to the component shortage, to the mounting attachment portion from which the pre-served feeder is detached when the feeder attached to the mounting attachment portion is predicted to be subjected to the component shortage while the mounting attachment portion is in a predetermined serving state such that there is no vacancy in the mounting attachment portion and the pre-served feeder to be used in the next and subsequent productions is attached to a part of the mounting attachment portion.

2. The management device according to claim 1, wherein when the mounting attachment portion is in the predetermined serving state and two or more feeders are predicted to be subjected to component shortages within a predetermined period, the management control section causes the mobile work device to execute the pre-replacement process on a feeder predicted to be subjected to a component shortage following a feeder predicted to be subjected to a first component shortage before the component shortage of the feeder.

3. The management device according to claim 1, wherein the management device executes any one or more of the following (1) to (4): (1) the attachment portion further includes a buffer attachment portion from which the mounting section cannot pick up the component, and the management control section retracts the pre-served feeder detached from the mounting attachment portion to the buffer attachment portion; (2) the mounting system has multiple modules including the attachment portion, and the management control section retracts the pre-served feeder detached from the mounting attachment portion to an attachment portion of a module closer to a detachment module; (3) the mounting system includes a storage section provided in a production line configured by the mounting device and configured to temporarily store a provision feeder to be provided to the supply section and a recovery feeder recovered from the supply section, and the management control section retracts the pre-served feeder detached from the mounting attachment portion to the storage section; and (4) the management control section retracts the pre-served feeder detached from the mounting attachment portion to the accommodation section and temporarily stores the pre-served feeder in the accommodation section.

4. The management device according to claim 3, wherein the management control section determines a retraction destination to which the pre-served feeder is to be retracted, in a priority order of temporary storage in the buffer attachment portion, the attachment portion of the module closer to the module from which the pre-served feeder is detached, the storage section, and the accommodation section.

5. The management device according to claim 1, wherein the wherein the management device executes at least one of the following (5) to (7): (5) the management control section causes the mobile work device to detach the pre-served feeder closer to the feeder predicted to be subjected to a component shortage from the mounting attachment portion; (6) the management control section causes the mobile work device to detach the pre-served feeder used for production later than other feeders from the mounting attachment portion; and (7) the management control section causes the mobile work device to detach feeders in order from the pre-served feeder located on an end side excluding the feeder currently used for production and a replacement feeder to be subjected to the pre-replacement process, from the mounting attachment portion.

6. The management device according to claim 1, wherein the management device executes at least one of the following (8) and (9): (8) the management control section acquires information regarding a current production status at a predetermined timing during the mounting process, predicts the component shortage of the feeder based on the acquired information regarding the production status, and sets execution information in the pre-replacement process; and (9) the management control section predicts the component shortage of the feeder when a production plan including multiple pieces of mounting condition information is created based on information regarding a feeder to be used and information regarding use of a component, and sets the execution information in the pre-replacement process.

7. The management device according to claim 1, wherein the management control section causes the mobile work device to replace the feeder predicted to be subjected to the component shortage with a replacement feeder that has been subjected to the pre-replacement process after the component shortage occurs in the feeder, and to move the retracted pre-served feeder to the mounting attachment portion.

8. A mounting system comprising:
the management device according to claim 1;
a mounting device including a mounting section configured to mount a component on a mounting target, a supply section configured to attach a feeder holding the component to an attachment portion having multiple mounting attachment portions from which the mounting section is capable of picking up the component, and a mounting control section configured to cause the mounting section to pick up the component from the feeder at a position designated in mounting condition information, while cause the mounting section to execute a spare component pickup process of picking up the component from a replacement feeder attached to a mounting attachment portion at a position not designated in the mounting condition information when a component shortage occurs in the feeder; and
a mobile work device including an accommodation section configured to accommodate the feeder, and a moving control section configured to recover the feeder from the supply section and/or attach the feeder to the supply section and move the feeder.

9. A mobile work device used in a mounting system provided with a mounting device including a mounting section configured to mount a component on a mounting target, a supply section configured to attach a feeder holding the component to an attachment portion having multiple mounting attachment portions from which the mounting section is capable of picking up the component, and a mounting control section configured to cause the mounting section to pick up the component from the feeder at a position designated in mounting condition information, while cause the mounting section to execute a spare component pickup process of picking up the component from a replacement feeder attached to a mounting attachment portion at a position not designated in the mounting condition information when a component shortage occurs in the feeder, the mobile work device comprising:
an accommodation section configured to accommodate the feeder; and a moving control section configured to recover the feeder from the supply section and/or attach the feeder to the supply section and move the feeder, and execute a pre-replacement process of detaching a pre-served feeder from the mounting attachment portion before the component shortage of the feeder and attaching a replacement feeder, corresponding to the feeder predicted to be subjected to the component shortage, to the mounting attachment portion from which the pre-served feeder is detached when the feeder attached to the mounting attachment portion is predicted to be subjected to the component shortage while the mounting attachment portion is in a predetermined serving state such that there is no vacancy in the mounting attachment portion and the pre-served feeder to be used in the next and subsequent productions is attached to a part of the mounting attachment portion.

10. A management method used in a mounting system provided with a mounting device including a mounting section configured to mount a component on a mounting target, a supply section configured to attach a feeder holding the component to an attachment portion having multiple mounting attachment portions from which the mounting section is capable of picking up the component, and a mounting control section configured to cause the mounting section to pick up the component from the feeder at a position designated in mounting condition information, while cause the mounting section to execute a spare component pickup process of picking up the component from a replacement feeder attached to a mounting attachment portion at a position not designated in the mounting condition information when a component shortage occurs in the feeder, and a mobile work device including an accommodation section configured to accommodate the feeder, and a moving control section configured to recover the feeder from the supply section and/or attach the feeder to the supply section and move the feeder, the management method comprising:
a step of causing the mobile work device to execute a pre-replacement process of detaching a pre-served feeder from the mounting attachment portion before the component shortage of the feeder and attaching a replacement feeder, corresponding to the feeder predicted to be subjected to the component shortage, to the mounting attachment portion from which the pre-served feeder is detached when the feeder attached to the mounting attachment portion is predicted to be subjected to the component shortage while the mounting attachment portion is in a predetermined serving state such that there is no vacancy in the mounting attachment portion and the pre-served feeder to be used in the next and subsequent productions is attached to a part of the mounting attachment portion.

* * * * *